(12) United States Patent
Keil (10) Patent No.: US 8,832,463 B2
(45) Date of Patent: Sep. 9, 2014

(54) METHOD OF VERIFYING AN IDENTIFICATION CIRCUIT

(75) Inventor: Gernot Keil, Braunweiler (DE)

(73) Assignee: KHS GmbH, Dortmund (DE)

( * ) Notice: Subject to any disclaimer, the term of this patent is extended or adjusted under 35 U.S.C. 154(b) by 154 days.

(21) Appl. No.: 13/063,760

(22) PCT Filed: Dec. 15, 2009

(86) PCT No.: PCT/EP2009/008956
§ 371 (c)(1),
(2), (4) Date: Mar. 14, 2011

(87) PCT Pub. No.: WO2010/081517
PCT Pub. Date: Jul. 22, 2010

(65) Prior Publication Data
US 2011/0264921 A1    Oct. 27, 2011

(30) Foreign Application Priority Data

Jan. 14, 2009   (DE) .......................... 10 2009 005 255

(51) Int. Cl.
*G06F 21/02* (2006.01)
*H01L 23/544* (2006.01)
*H01L 23/00* (2006.01)

(52) U.S. Cl.
CPC ............ *H01L 23/544* (2013.01); *H01L 23/576* (2013.01); *H01L 2223/54433* (2013.01); *H01L 2223/5444* (2013.01)
USPC ....................................................... 713/189

(58) Field of Classification Search
CPC ................... B41J 2/17543; G03G 2215/0697; G03G 15/0863; G03G 2221/1823; G03G 21/1875; G03G 21/1892; H04L 9/083
See application file for complete search history.

(56) References Cited

U.S. PATENT DOCUMENTS

| | | | |
|---|---|---|---|
| 6,212,638 B1 * | 4/2001 | Lee et al. ...................... | 713/179 |
| 6,748,182 B2 * | 6/2004 | Yoshida et al. ................. | 399/12 |
| 7,589,642 B1 * | 9/2009 | Mui .............................. | 340/12.3 |
| 7,657,035 B2 * | 2/2010 | Yato et al. ..................... | 380/277 |
| 7,716,098 B2 | 5/2010 | Silverbook | |
| 7,840,743 B2 | 11/2010 | Clarke | |
| 8,132,264 B2 * | 3/2012 | Epstein .......................... | 726/28 |

(Continued)

FOREIGN PATENT DOCUMENTS

CA            2344429 B        12/2003

*Primary Examiner* — Michael R Vaughan
*Assistant Examiner* — Richard McCoy
(74) *Attorney, Agent, or Firm* — Shlesinger, Arkwright & Garvey LLP (57) ABSTRACT

The invention relates to a method for verifying an identification circuit (5) integrated in a component to be identified, having the following steps: a) entering a primary key in the identification circuit (5), b.) reading a secondary key output by the identification circuit (5) in reaction to the input of the primary key, c.) providing a control key associated with the primary key, d.) comparing the control key to the output secondary key, e.) providing a result of the comparison step, wherein in case of a match of the secondary key to the control key, the component having the identification circuit is identified as an original component, and in the opposite case, as a counterfeit component, and wherein the identification circuit (5) comprises non-conducting, semiconducting, and conducting materials disposed and connected to each other such that at least one electronic circuit configuration is formed, comprising at least one defined mathematical function and configured for determining the secondary key from the primary key inputted into the identification circuit (5), and providing said secondary key for readout, at least using the at least one mathematical function.

17 Claims, 6 Drawing Sheets

(56) References Cited

U.S. PATENT DOCUMENTS

| | | |
|---|---|---|
| 2005/0038755 A1* | 2/2005 | Silverbook et al. ............ 705/67 |
| 2005/0071730 A1* | 3/2005 | Moyer et al. ................. 714/758 |
| 2008/0199597 A1 | 8/2008 | Huebler |
| 2008/0297354 A1 | 12/2008 | Foley |
| 2011/0033054 A1* | 2/2011 | Garcia morchon et al. .. 380/279 |
| 2011/0091037 A1* | 4/2011 | Pinder .......................... 380/255 |
| 2011/0264921 A1 | 10/2011 | Keil |
| 2012/0303967 A1* | 11/2012 | Chia et al. .................... 713/189 |

\* cited by examiner

METHOD OF VERIFYING AN IDENTIFICATION CIRCUIT

CROSS REFERENCE TO RELATED APPLICATIONS

This application is the US national stage of PCT application PCT/EP2009/008956, filed 15 Dec. 2009, published 22 Jul. 2010 as WO2010/081517, and claiming the priority of German patent application 102009005255.0 itself filed 14 Jan. 2009, whose entire disclosures are herewith incorporated by reference.

TECHNICAL FIELD

The present invention relates to a method of verifying identification circuits, in particular for verifying the authenticity of a component identified with an identification circuit.

DESCRIPTION OF THE PRIOR ART

Manufacturers of high-quality products are being increasingly faced with counterfeits of their products. Far from it being just inexpensive and easily produced parts that are being copied and placed on the market as inferior quality counterfeits, complex components and assemblies and even whole devices and systems are now being imitated and offered on the open market.

This is happening with increasingly high quality and precision with the result that it can be very difficult to tell the counterfeits from the corresponding genuine parts made by the original manufacturer. Where once a brief visual check was all that was needed to identify a counterfeit, today even experts have great difficulty in recognizing imitations, and positive identification is only possible following expensive laboratory analysis. Even distribution channels for counterfeits are attaining increasingly sophisticated standards to the extent that they may not provide any clues as to origin. This lack of identifiability means that neither customers when they buy the products, nor the manufacturers themselves, e.g. when a claim is made under warranty, can say with any certainty whether the part in question is a genuine product or a counterfeit.

Different methods for identifying products are known, such as for example bar codes or other security labels. However these have the drawback that they can usually be reproduced with little effort and expense.

On the other hand, three-dimensional logic circuits of the type known from publication DE 10 2005 033 218 A1 are examples of structures which are hard and even impossible to replicate. This publication describes a three-dimensional circuit with at least two superimposed substrate layers which comprise conductor tracks and/or circuit elements, with the substrate layers being flexibly configured and the tracks and/or circuit elements consisting of electrical functional materials.

Using such circuits to verify the authenticity of a component identified by a circuit is not known from the prior art however.

It is therefore an object to identify components that are to be protected by means of a circuit that is hard or impossible to replicate and to provide a method of verifying the authenticity of the component that is identified by the circuit.

SUMMARY OF THE INVENTION

This object is resolved by an inventive method according to claim 1.

In this case the method of verifying an identification circuit integrated in a component to be identified comprises the following steps:

a) Entering a primary key in the identification circuit,
b) Reading out a secondary key outputted by the identification circuit in reaction to the entry of the primary key,
c) Providing a control key associated with the primary key,
d) Comparing the control key with the outputted secondary key,
e) Providing a result of the comparison step, wherein in case of a match of the secondary key with the control key, the component having the identification circuit is identified as a genuine component, and in the opposite case as a counterfeit component, and wherein the identification circuit comprises non-conducting, semiconducting and conducting materials disposed and connected to each other such that at least one electronic is circuit configuration is formed, comprising at least one defined mathematical function and configured for determining the secondary key from the primary key entered in the identification circuit, and for providing said secondary key for readout, while at least using the at least one mathematical function.

The described identification circuit can, as described hereinbefore, comprise an electronic circuit configuration formed by non-conducting, semiconducting and conducting materials and referred to hereinafter simply as circuit. The materials are so disposed that switch elements, such as for example transistors, capacitors, coils, diodes, resistors and/or memory elements, are assembled and connected with each other by communication technology. The particular layout of the individual switch elements of the circuit relative to each other determines a defined processing of the signals introduced into the circuit. The processing that is defined by the layout represents a defined mathematical function according to which an input signal is modified and a corresponding output signal is generated. In this way it is possible to store a mathematical function in the circuit by way of the layout. The circuit can be configured either in a single plane only or in multiple layers as a three-dimensional circuit.

If therefore a first input key, for example the afore-mentioned primary key, is entered in the identification circuit, the input key is modified according to the function stored in the circuit and output as a modified output key, such as for example the afore-mentioned secondary key. The stored mathematical function can be determined arbitrarily when the identification circuit is manufactured. The keys themselves consist for example of data records or identifiers which comprise signals or signal sequences of the type known in data communication.

A suitable identification of the respective component can be guaranteed by the identification circuit being disposed directly on the component. Although the identification circuit can basically also be provided on a tag and glued to the component, this does not generally guarantee that the component is actually a genuine part. Only the authenticity of the identification circuit could be guaranteed in this case. To be able to guarantee the authenticity of the actual component as well however, it is for example possible to dispose the identification circuit in at least one defined region of the component directly on a surface provided for this purpose or in a recess. The identification circuit can for example be printed directly onto the component. This can be effected by the non-conducting, semiconducting and conducting material being applied or printed in layers at the allotted positions and the respective switch elements being built up and conductively interconnected layer by layer in this way. In this way it is moreover possible to build up multilayer circuits with the result that complex circuits can also be realized.

Depending on the material of the component to be identified or of the particular region of the component in which the identification circuit is to be disposed, an insulating layer can be provided between the component and the switch elements of the identification circuit. For example the insulating layer can also be printed on before the actual switch element is printed on.

Furthermore, to protect or cover the identification circuit it can be overlaid with an additional layer which can also be applied in the printing process and the identification circuit be covered. Similarly the identification circuit can be integrated in the interior of the component so as to be outwardly invisible and covered by a homogeneous surface of the component. In this way it is possible to identify the component concerned with the aid of the identification circuit without this being outwardly visible, since the identification circuit is integrated in the component in a concealed manner.

According to another embodiment the identification circuit can provide a plurality of defined mathematical functions, whereby a selection of a function used to determine the output key—such as for example the secondary key—from the plurality of functions is dependent on the entered input key, such as for example the primary key.

Thus multiple mathematical functions can be stored in the at least one electronic circuit. As hereinbefore described, this is achieved by appropriate layouts and connections of the circuit elements concerned and/or additional switch elements.

If the selection of the function provided for determining the output key is dependent on the entered input key, then a defined configuration or a defined data format and/or certain data values of the input key for example can be provided as a criterion of the selection. If these are satisfied, then the function provided for this input key is applied.

Consequently therefore, a predetermined function can be provided for generating the output key for one particular or for a number of defined input keys. If on the other hand a different input key, hereinafter referred to as a 'false' input key, is entered, then one or more of the other functions are applied. This has the effect of a different 'false' output key being generated accordingly. The false output key can be subsequently identified in a comparison step.

The possibility of the stored mathematical functions being determined by test methods and of the identification circuit being imitated in this way can therefore be prevented or at least rendered difficult. According to this embodiment, only if the correct input key is entered is the corresponding function used to generate the associated second output key which then yields a positive result in the comparison test to be carried out of the second output key with the control key.

A selection of a particular function can of course also be made to depend on other events. Thus for example a random switching can assign to the entry of an input key a randomly selected function and by means thereof determine the respective output key. Other data and functions can also be integrated. For instance, the selection of a particular mathematical function can be linked to a time and/or a date of the key entry.

Thus for example the current date or the current time can be integrated in the mathematical function and used to generate a date-dependent or time-dependent output key. In order to have the identical date or the identical time both to generate the output key and to check the output key that is output by the identification circuit, the current date or the current time respectively can for example be entered in the identification circuit together with the primary key. The control key is also provided date-dependently or time-dependently accordingly.

The mathematical functions can also be provided in order to be combined with one another in a predetermined or variable sequence to generate an overall master function. In this respect the linking of the functions can be effected according to the above-described choice of functions having regard to other events as well, for example with the involvement of data and functions.

Likewise of course only a single defined function of the plurality of functions can be permanently provided for determining the output key. This could be advisable for example in order to enable a comparison of the control key with the outputted output key in a simple way and at the same time to provide the remaining functions of the plurality of functions as so-called 'dummy' functions which are not used. In this way the complexity of the circuit can be increased such that reproducibility as part of a structure analysis and, as the case may be, imitation, is prevented or rendered more difficult. Generally these circuits must be analyzed with great effort and expense to identify the functions that are actually used, such an analysis usually involving the destruction of the circuit to be analyzed.

The control key can also be provided by a database. The control key can therefore already be stored in the database as a fixed value. In this case the output key outputted by the identification circuit is compared in a comparison step with the control key previously read out of the database. If the result of the comparison is positive, the output key and the control key match. This means that the identification circuit in question, and hence also the component which it identifies, is a genuine identification circuit and a genuine component respectively. If the output key and the control key do not match on the other hand, the identification circuit and consequently the component are counterfeit. It goes without saying that the control key can equally be generated and provided on the basis of particular events before the reading-out. As already described hereinbefore, a date dependency or time dependency can be enabled in this way for example.

Moreover the primary key can be provided by the database. This means that the primary key is also stored in the database. An associated control key can already be retrievably assigned to the primary key in this way for instance. Both the primary key and the control key can be directly obtained from the database to perform the described method of verification.

According to a further embodiment the method in step a) exhibits n recursion steps, with the $j^{th}$ recursion step, where $j \in \{1, 2, \ldots, n\}$, comprising the following steps:
- a1) Read out a $j^{th}$ output key outputted by the identification circuit in reaction to the entry of the $(j-1)^{th}$ input key,
- a2) Read out from a database a $j^{th}$ input key assigned to the $j^{th}$ output key and
- a3) Enter the $j^{th}$ input key in the identification circuit, with the primary key being entered as $0^{th}$ input key and the secondary key in step b) being created on the basis of the $(j=n)^{th}$ input key.

Additional recursion steps are therefore provided for the described method, wherein the primary key is entered as an initial input key in the identification circuit at the beginning and the secondary key is read out at the end of the method. The foregoing steps a1)-a3) of the n recursion steps can be performed between these two steps a) and b).

Provision may also be made such that access to the database for reading out the respective $j^{th}$ input key requires an access codeword.

The codeword can be a user code for example which is known only to a restricted group of persons. The security of the described method can be further enhanced by way of this access restriction. If the codeword is not known, access to the database is denied. As a consequence step a2) cannot be carried out and so no input key can be retrieved from the database.

Access to the database to read out the $j^{th}$ input key can also require the $j^{th}$ output key.

Accordingly the correct output key of the is recursion step concerned is used to access the database. Said output key can for example be used in combination with the codeword or on its own instead of the codeword for an access restriction to the database.

Provision can also be made for the $(j-1)^{th}$ input key to be used to read out the $j^{th}$ input key.

The previous input key is used to restrict access to the database. If said input key is correct, access to the database is granted, otherwise denied. Here again, a simultaneous use in combination with the codeword and/or the output key or a sole use of the input key can be provided in order to restrict access.

According to another embodiment, the step of reading out the $j^{th}$ output key comprises a reading-out a $j^{th}$ random number from a random switching of the identification circuit, wherein the $j^{th}$ output key can be used with the $j^{th}$ random number for an assignment to the $j^{th}$ input key.

For example the random switching, which is provided by a random generator, can generate at least one random number which is selected from a predetermined number z of random numbers. In the database, each of the z random numbers out of the number z of random numbers is assigned a corresponding input key such that z input keys are stored in the database for this step. Depending on the selected random number, the input key that is assigned to the selected random number is then selected.

If for example the random switching can determine a random number from a plurality of random numbers which are chosen as integers and are between 1 and 10, then ten input keys assigned to the random numbers can be made available in the database for this step. The random number can be transmitted to the database in order to retrieve the input key from the database. If the process is run several times, security can be increased still further because all random numbers must be stored in the identification circuit and in the database be assigned to the associated respective input key such that, with each run, one input key each is determined beyond doubt for the same component or the same identification circuit. If a false random number is provided by a faulty identification circuit, a false input key is determined accordingly, such that the identification circuit can be identified as counterfeit.

Again according to the embodiment referred to above, the identification circuit can provide a plurality of defined mathematical functions, with a choice of a function used to determine the $j^{th}$ output key or secondary key from the plurality of functions being dependent on the $(j-1)^{th}$ input key or the $(j=n)^{th}$ input key.

According to another embodiment the steps of the method can be executed by way of at least one mobile processing unit with input and output devices. Such a processing unit can for example be effected in the form of a hand scanner or a mobile computer having appropriate input and output devices. This enables a rapid check of the identification circuit such that it is possible to perform a check of components or machines directly on site at their location or for example at fairs and exhibitions and to draw an immediate conclusion by way of the comparison result obtained.

Static processing units with appropriate input and output devices, for example in the form of scanners, can of course also be provided for checking the components.

Provision can also be made for the database to be stored in the processing unit or executed externally and connected to the processing unit by communication technology. Consequently a local memory can be integrated in the mobile or local processing unit or connected to the latter in which the database is stored. Thus the database for the processing unit can be made available for example by way of CDs, DVDs, memory sticks, external hard drives or similar removable media.

It is also possible for the processing unit to be able to access, by way of remote access via a network, a central server on which the database is provided. According to this embodiment, the database on the central server and the keys therein stored can be accessed remotely and from any location by way of the processing unit. Thus the processing unit can access the database by way of LAN, WLAN or suitable communication standards as well as mobile radio standards for example. The database can comprise a secure access to protect it from unauthorized access and reading of the keys. This access, as hereinbefore described, can be effected by codeword or by other access-restricting control options.

Moreover the input and the output steps in and out of the identification circuit respectively can be effected by way of at least one input and output device provided on the identification circuit.

This at least one input and output device permits a data interchange between the identification circuit and the processing unit in this way. A combined input and output pad can be provided for this purpose on the identification circuit for example. It is of course equally possible to provide multiple input and output pads as well as separate input and separate output pads. The pads are impinged upon by an appropriately executed mobile or static processing unit such that a communications link for data interchange is established. The pads can be designed as flat electrodes or helical coils for example.

According to a further embodiment the input and the output steps in and out of the identification circuit respectively can be executed without touching the component or identification circuit that is to be identified. Beside the direct impingement of one or more input and output pads described above, the input and output device of the identification circuit can therefore equally be executed for a contactless transfer of data. Thus for example a wireless communication can be effected in the form of an optical or electromagnetic data transfer.

The identification circuit can also comprise at least one power supply. According to this the identification circuit comprises its own power supply which can be provided in the form of a battery for example. It is of course equally possible to provide other power supplies or connection contacts for an external power supply via which a voltage can be applied to or injected into the identification circuit. The injection of the voltage into the identification circuit can be effected by a plurality of power supply pads that are provided on the identification circuit for this purpose. These can be designed as flat electrodes or helical coils for example. A voltage injection is also possible via the input and output pads hereinbefore described for the data interchange, as well as by way of at least one inductive coupling.

According to another embodiment the method may also comprise a reading-out at least one memory integrated in the identification circuit. As already described hereinbefore, the identification circuit can comprise at least one integrated memory in which data are stored which can be read out and used for example for creating the output key.

Furthermore a method is provided for producing the hereinbefore described identification circuit for authenticity protection. This comprises at least one of the following steps:

Application of non-conducting, semiconducting and conducting material in each of regions provided for this on a component or other carrier, Coupling of semiconducting and conducting regions so that at least one mathematical function is established, Coupling of semiconducting and conducting regions with at least one output pad, Coupling of semiconducting and conducting regions with at least one power supply pad, Moreover a component with integrated identification circuit is provided wherein the integrated identification circuit is configured for entering an input key into the identification circuit and for reading out an output key outputted by the identification circuit in reaction to the entry, and wherein the identification circuit also comprises non-conducting, semiconducting and conducting materials which are so disposed and interconnected that at least one electronic circuit arrangement is formed which comprises at least one defined mathematical function and is so configured as to determine—from the input key entered into the identification circuit—the output key at least by way of the at least one mathematical function and to make said output key available for reading out.

A processing unit is also provided which is configured to execute the method hereinbefore described. The processing unit can be realized as a mobile or static processing unit.

Further advantages and embodiments of the invention are indicated in the description and the attached drawing.

It goes without saying that the characteristics set out above and still to be explained below can be used not only in the indicated combination as the case may be but also in other combinations or in isolation without departing from the scope of the present invention.

DETAILED DESCRIPTION

Figure 1:
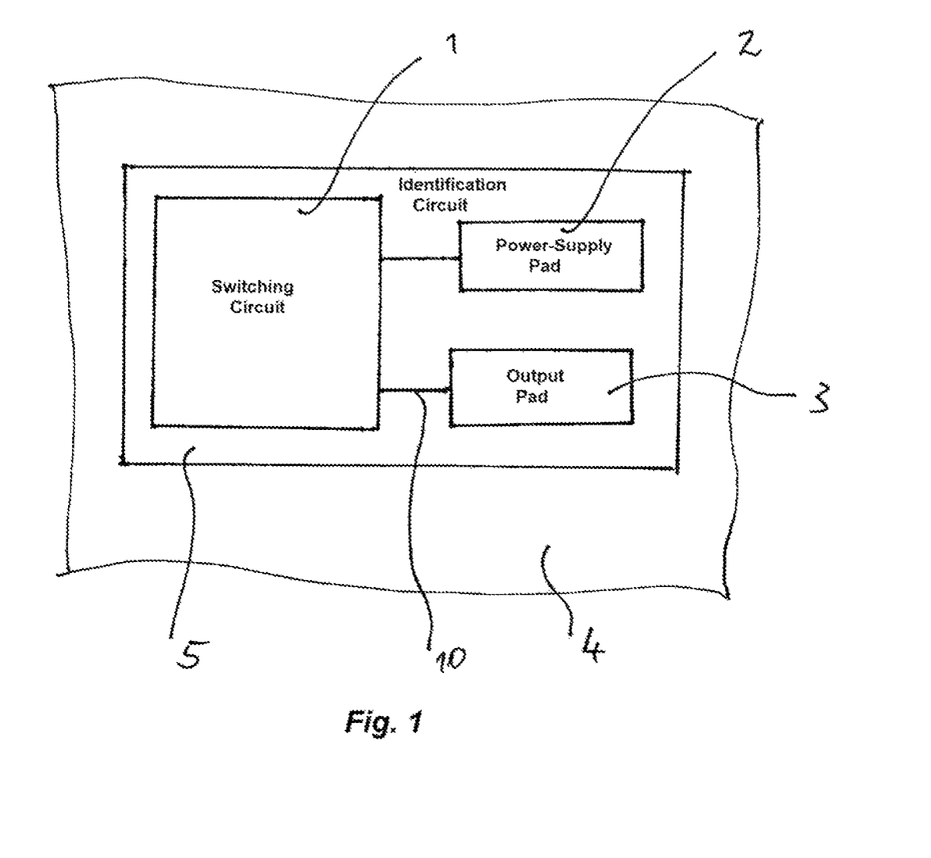
FIG. 1 shows an identification circuit applied to a component in schematic plan view.

FIG. 1 shows a schematic representation of an identification circuit 5 applied to a component 4 having a switching circuit 1 representing an electronic circuit, a combined input and output pad 3 and at least one power supply pad 2 which are each integrated in identification circuit 5 and connected with switching circuit 1.

Figure 2:
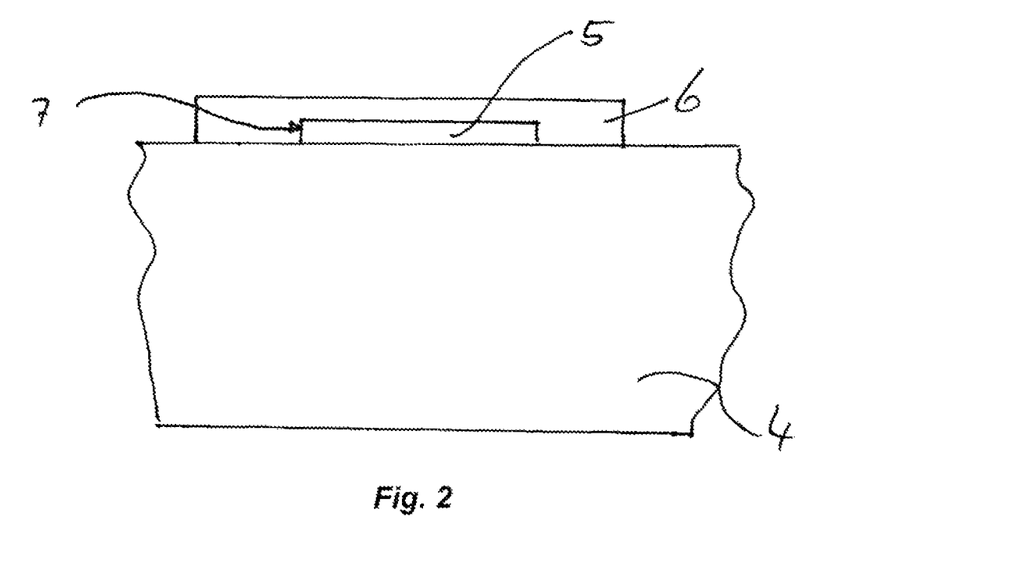
FIG. 2 shows the identification circuit disposed on the component in a schematic elevation.

FIG. 2 shows a schematic representation of identification circuit 5 disposed on component 4, wherein outer free surfaces of identification circuit 5 are covered and sealed by way of an additional covering layer or cover 6 such that they are outwardly neither visible nor easily accessible.

Figure 3:
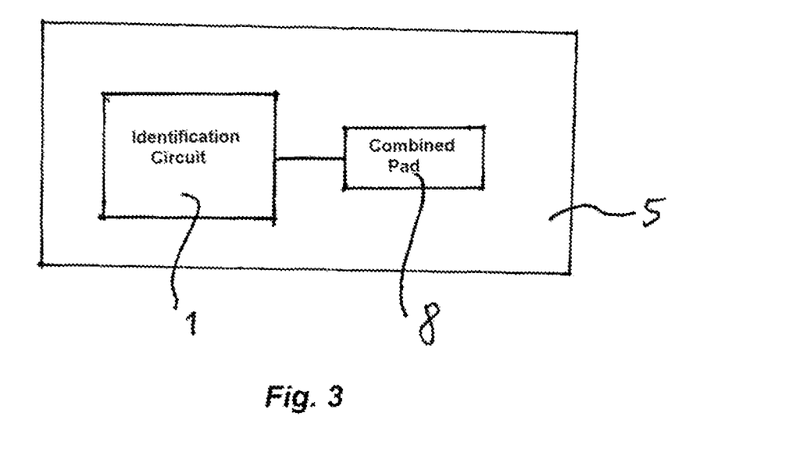
FIG. 3 shows a further embodiment of an identification circuit in a schematic plan view.

FIG. 3 shows a schematic plan view of an identification circuit 5 having a combined power supply and input and output pad 8 that is connected with a switching circuit 1 by communication technology.

Figure 4:
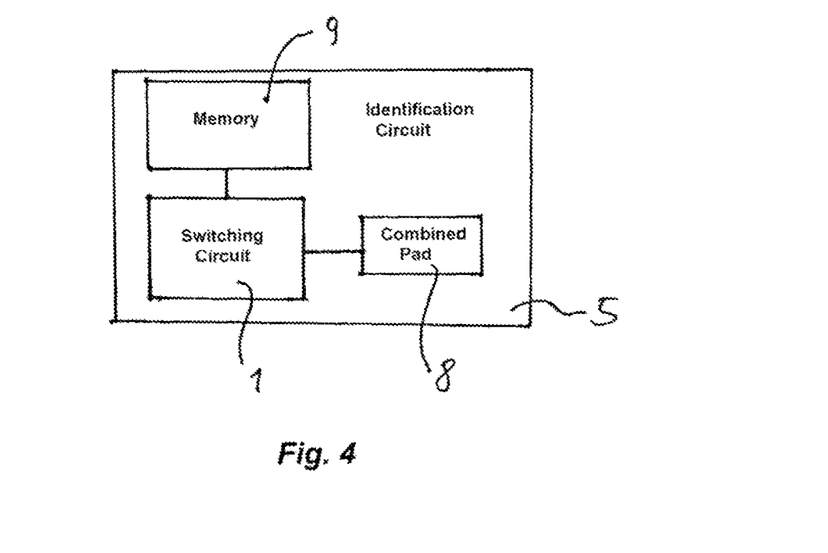
FIG. 4 shows a further embodiment of an identification circuit in schematic plan view.

FIG. 4 shows a schematic plan view of an identification circuit 5 having a switching circuit 1, a combined power supply and input and output pad 8 as well as an additional memory 9 connected with the switching circuit 1.

Figure 5:
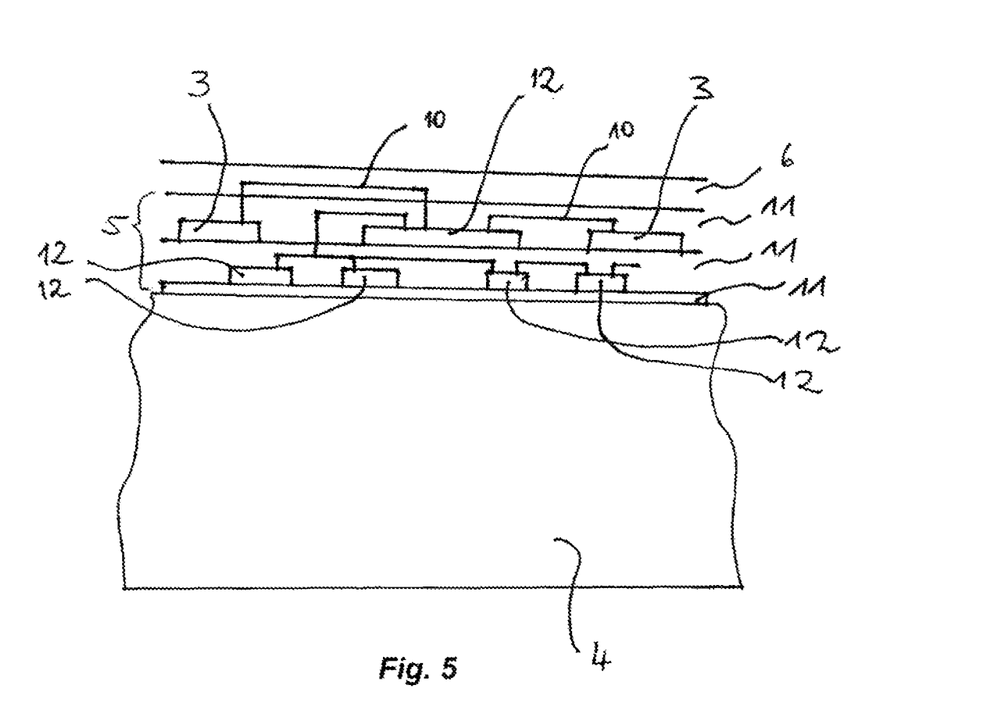
FIG. 5 shows a further embodiment of an identification circuit in a lateral cross-section.

FIG. 5 shows a lateral cross-section through an identification circuit 5 disposed on a component 4 and which is composed of multiple insulating layers 11 of non-conducting material and also comprises active elements 12 made of conducting or semiconducting material which are interconnected by communication technology via conducting sections 10. Furthermore the identification circuit comprises input and output pads 3 and is covered or sealed by cover 6 on its outer surfaces which are not in contact with component 4.

Figure 6:
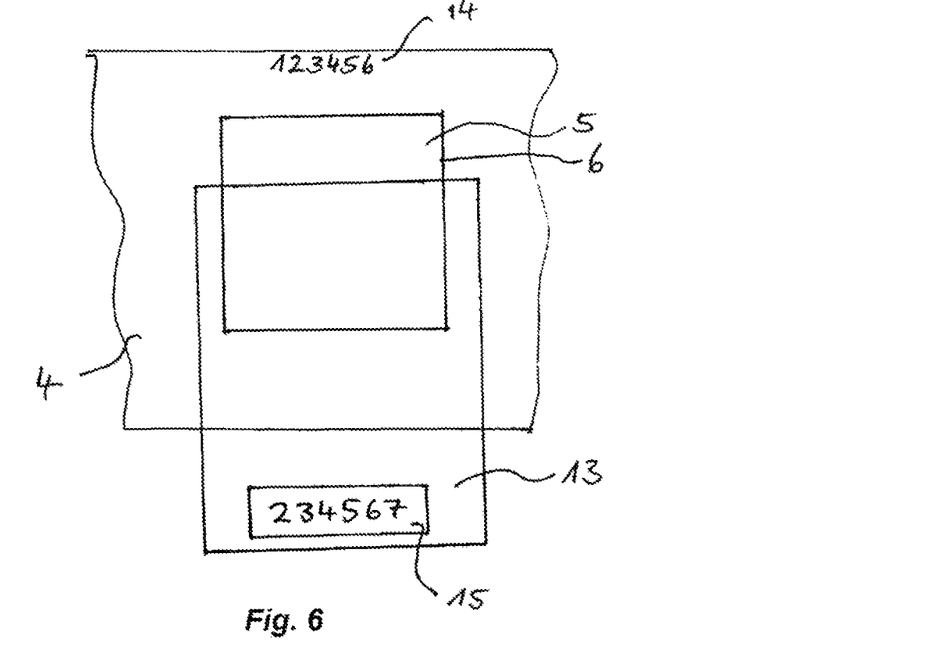
FIG. 6 shows a further embodiment of an identification circuit applied to a component in schematic plan view.

FIG. 6 shows a schematic plan view of an identification circuit 5 which is disposed on a component 4 and which exhibits a cover 6. An input key 14 is entered in the identification circuit 5. An output key 15 can then be read out by way of an input and output device 13. As described hereinbefore, this can be provided as a mobile or static processing unit and comprise input and output devices. Input key 14 can be mounted on component 4 itself, requested by the manufacturer or be tabulated or provided by a database in other known manner.

Figure 7A:
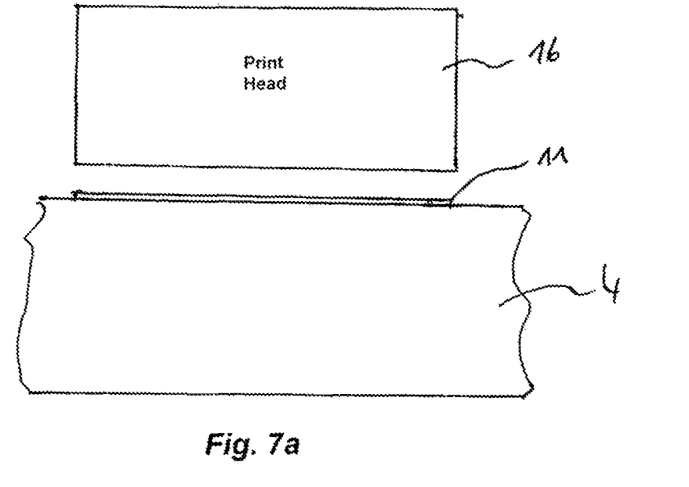
FIG. 7a shows a further embodiment of an identification circuit after an initial manufacturing step in schematic elevation.

FIG. 7a shows an insulating layer 11 disposed on a component 4 which is printed on to the component 4 by a print head 16. This printing on of insulating layer 11 represents a first step of the method of applying the identification circuit to component 4.

Figure 7B:
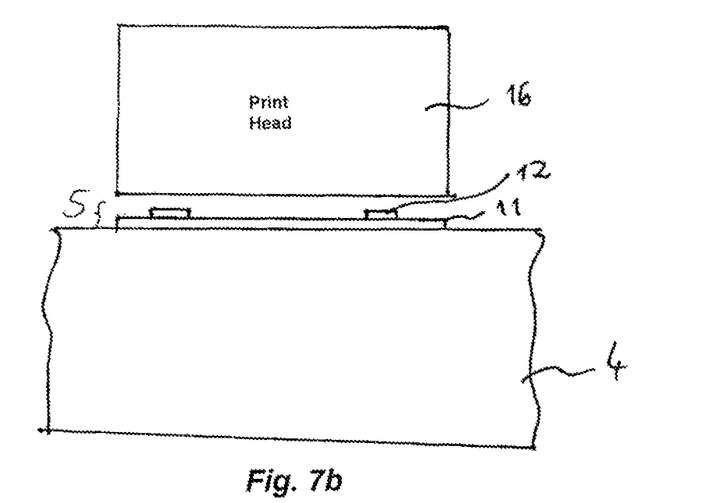
FIG. 7b shows the identification circuit after a second manufacturing step in schematic elevation.

FIG. 7b shows identification circuit 5 applied to component 4 after a further step of the method wherein the active elements 12 are printed on by way of print head 16 onto insulating layer 11. Active elements 12 can consist of a semiconducting or conducting material for example a semiconducting or conducting plastic or metal.

Figure 8:
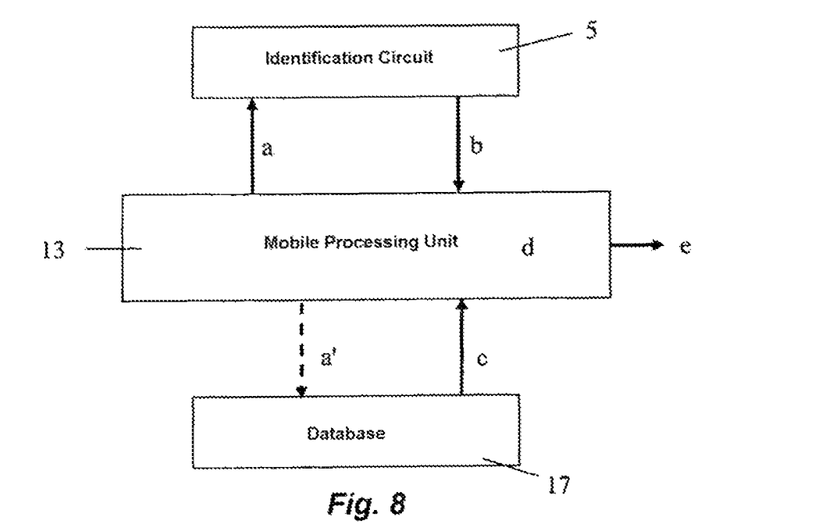
FIG. 8 shows a sequence diagram of a first embodiment of a method of verifying an identification circuit integrated in a component.

FIG. 8 shows a sequence diagram of a first embodiment of a method of verifying an identification circuit integrated in a component. According to this the embodiment shown comprises the following steps:

a) Entering a primary key in the identification circuit 5,
b) Reading out a secondary key outputted by the identification circuit 5 in reaction to the entry of the primary key.
c) Providing a control key associated with the primary key,
d) Comparing the control key with the output secondary key and
e) Providing a result of the comparison step.

In the event of a match of the secondary key with the control key, the component identified by the identification circuit is identified as a genuine component, otherwise as a counterfeit component. For this purpose a defined mathematical function is integrated in identification circuit 5 and the identification circuit is configured so as to determine, from the primary key entered into identification circuit 5, the secondary key at least by applying the mathematical function and to provide said secondary key for reading out. In the embodiment shown, the primary key entered in step a) is entered into identification circuit 5 by mobile processing unit 13. The primary key is stored in the mobile processing unit for this purpose. It is of course equally possible to store the primary key in an external memory or in an external database (not shown) which is coupled by communication technology with mobile processing unit 13 in such a way that mobile processing unit 13 has access to the data therein stored. In the embodiment shown, the control key is stored in database 17, with the identification key being assigned to the primary key that is used. In an optional step a' ) the primary key for the determination and subsequent reading out the associated control key can be transmitted to the database.

Figure 9:
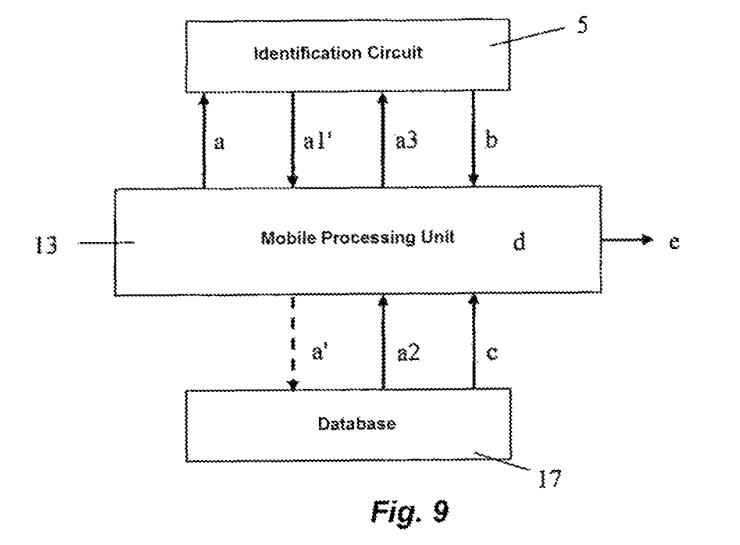
FIG. 9 shows a sequence diagram of a second embodiment of a method of verifying an identification circuit integrated in a component.

FIG. 9 shows a flowchart of a second embodiment of a method of verifying an identification circuit 5 integrated in a component. According to this the method from FIG. 8 may exhibit in step a) n recursion steps, whereby an embodiment for the case n=1 is represented below. According to this the method comprises the following steps:

a) Entering the primary key into identification circuit 5 by way of the mobile processing unit 13.

a1) Reading out, into mobile processing unit 13, of an output key outputted by identification circuit 5 in reaction to the entering the primary key, a2) Reading out from database 17 of an input key assigned to the output key, whereby this step can comprise a transmission a') of the output key from mobile processing unit 13 to database 17 in order to determine from database 17 the input key that is assigned to the output key.

a3) Entering the input key into identification circuit 5 by way of the mobile processing unit 13.

There then follow the following previously described steps:

b) Reading out a secondary key entered by the identification circuit 5 in reaction to the entry of the input key.

c) Providing a control key assigned to the primary key from database 17 into mobile processing unit 13, d) Comparing the control key with the outputted secondary key in the mobile processing unit and e) Providing of a result of the comparison step by way of mobile processing unit 13.

If the described recursion step with steps a1) to a3) is repeated n times, then in a $j^{th}$ recursion step with j=∈{1, 2, . . . n}, the $j^{th}$ output key outputted by the identification circuit in reaction to the entry of the $(j-1)^{th}$ input key is read out. A $j^{th}$ input key assigned to the $j^{th}$ output key is then read out of database 17 and the $j^{th}$ input key is entered into identification circuit 5. In this connection the primary key is entered as $0^{th}$ input key and the secondary key in step b) is created on the basis of the $(j=n)^{th}$ input key.

Figure 10:
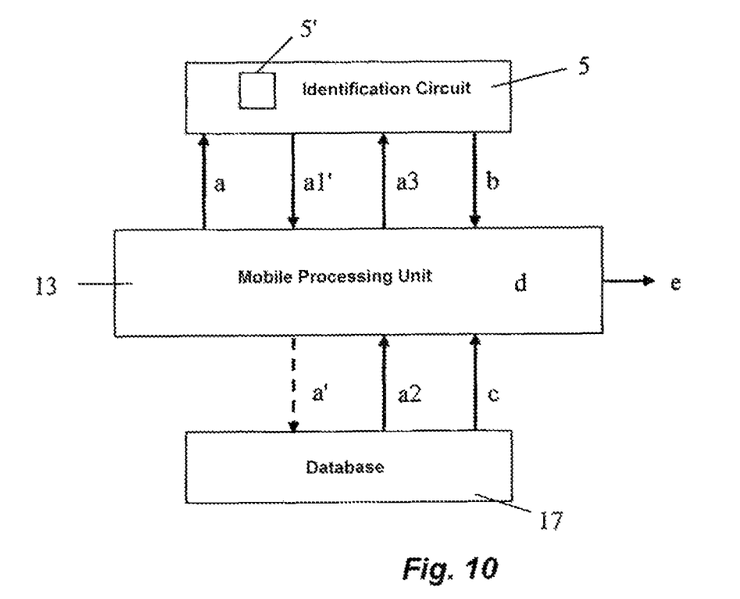
FIG. 10 shows a sequence diagram of a further embodiment of a method of verifying an identification circuit integrated in a component.

FIG. 10 shows a sequence diagram of a further embodiment of a method of verifying an identification circuit integrated in a component. The described embodiment is based on the embodiment according to FIG. 9 wherein step a1) of reading out the output key further comprises a reading-out a random number from a random switching 5' of identification circuit 5 configured as a random generator, and the output key is used with the random number for an assignment of the next input key that is read out from the database in step a2). To this end the random number in step a1') together with the output key is read out by mobile processing unit 13 and in a step a') entered into database 17 for the random number-dependent determination of the input key. Steps a2), a3), b), c), d) and e) already described in FIG. 9 are then carried out.

In the embodiments hereinbefore described, it may also be provided that step d) of comparing the control key with the secondary key is effected within the identification circuit. To this end the control key can be stored in the identification circuit or for example be entered by the mobile processing unit in the control circuit. In this case the control circuit is configured so as to execute the described comparison step and to provide a result of the comparison step. Consequently it is the identification circuit which decides whether the identification circuit and/or the associated component is a genuine component or a counterfeit.

The invention claimed is:

1. A method of verifying authenticity of a component comprising an identification circuit based on using one chip integrated into the component to be authenticated, the method comprising the following steps:
   a) entering, by an input and output device, a primary key in the identification circuit;
   b) reading out, by the input and output device, a secondary key outputted by the identification circuit in reaction to entry of the primary key;
   c) providing a control key associated with the primary key;
   d) comparing, by the identification circuit, the control key with the secondary key; and
   e) providing, by the identification circuit, a result of the comparing step, wherein, in case of a match of the secondary key with the control key, the authenticity of the component is verified as as a genuine component manufactured by an authorized manufacturer and otherwise as a counterfeit component not manufactured by the authorized manufacturer, and wherein the identification circuit comprises non-conducting, semiconducting and conducting materials that are disposed and interconnected in such a manner that at least one electronic circuit arrangement is created which comprises a plurality of defined mathematical functions and is configured so as to determine, from the primary key entered into the identification circuit, the secondary key while using at least one of the plurality of defined mathematical functions, and to provide the secondary key for readout, wherein selection of the at least one of the plurality of the defined mathematical functions used to determine the secondary key depends on the primary key.

2. The method according to claim 1, wherein the control key is provided by a database.

3. The methods according to claim 1, wherein the primary key is provided by a database.

4. The method according to claim 2, wherein the step of entering exhibits n recursion steps, wherein the $j^{th}$ recursion step with j∈{1, 2, . . . n} comprises the following steps:
   a1) reading out a $j^{th}$ output key outputted by the identification circuit in response to the entry of a $(j-1)^{th}$ input key;
   a2) reading out from a database a $j^{th}$ input key assigned to the $j^{th}$ output key; and
   a3) entering the $j^{th}$ input key in the identification circuit, with the primary key being entered as $0^{th}$ input key and the secondary key in the step of reading out being created on the basis of the $(j=n)^{th}$ input key.

5. The method according to claim 4, wherein access to the database to read out the respective $j^{th}$ input key requires an access codeword.

6. The method according to claim 4, wherein access to the database to read out the $j^{th}$ input key requires the $j^{th}$ output key.

7. The method according to claim 4, wherein the $(j-1)^{th}$ input key is used to read out the $j^{th}$ input key.

8. The method according to claim 4, wherein the step of reading-out the $j^{th}$ output key comprises reading-out a $j^{th}$ random number from a random generator of the identification circuit and the $j^{th}$ output key is used with the $j^{th}$ random number for an assignment to the $j^{th}$ input key.

9. The method according to claim 4, wherein selection of one function used to determine the $j^{th}$ output key or the secondary key from the plurality of defined mathematical functions depends on the $(j-1)^{th}$ input key and on the $(j=n)^{th}$ input key, respectively.

10. The method according to claim 1, wherein the input and output device is implemented by a mobile processing unit.

11. The method according to claim 2, wherein the database is stored in a mobile processing unit or is externally executed and is coupled with the mobile processing unit by communication technology.

12. The method according to claim 1, wherein the input and output device is comprised by the identification circuit.

13. The method according to claim 1, wherein the identification circuit is integrated in the component in a concealed manner.

14. The method according to claim 1, wherein the entering step and the reading out step into and out of the identification circuit, respectively, are executed without touching the component to be identified or the identification circuit.

15. The method according to claim 1, wherein the identification circuit comprises at least one power supply.

16. The method according to claim 1, and further comprising the step of reading out at least one memory integrated in the identification circuit.

17. A component comprising an identification circuit for verifying authenticity of the component, the identification circuit using one chip integrated into the component, wherein the identification circuit is configured to receive entry by an input and output device of an input key and to read out by the input and output device an output key outputted by the identification circuit in reaction to the input key, and wherein the identification circuit further comprises non-conducting, semiconducting and conducting materials disposed and connected to each other such that an electronic circuit configuration is formed which comprises a plurality of defined mathematical functions and configured for determining, by way of at least one of the plurality of defined mathematical functions, the output key from the input key entered in the identification circuit, and for providing the output key for readout, and wherein selection of the at least one of the plurality of the defined mathematical functions used to determine the output key depends on the input key, the identification circuit being further configured so as to execute a comparison of a control key with the output key within the identification circuit, wherein in case of a match of the output key with the control key the authenticity of the component is verified as a genuine component manufactured by an authorized manufacturer and otherwise as a counterfeit component not manufactured by the authorized manufacturer.

* * * * *